United States Patent
Mizukami et al.

(10) Patent No.: US 7,265,707 B2
(45) Date of Patent: Sep. 4, 2007

(54) SUCCESSIVE APPROXIMATION TYPE A/D CONVERTER

(75) Inventors: Yukihiro Mizukami, Ibaraki (JP); Ichirou Yamane, Nagaokakyou (JP); Kazuhisa Raita, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/407,083

(22) Filed: Apr. 20, 2006

(65) Prior Publication Data
US 2006/0238399 A1 Oct. 26, 2006

(30) Foreign Application Priority Data
Apr. 26, 2005 (JP) .............................. 2005-127581

(51) Int. Cl.
*H03M 1/34* (2006.01)
(52) U.S. Cl. .................. 341/163; 341/155; 341/118
(58) Field of Classification Search ................ 341/163, 341/118, 155
See application file for complete search history.

(56) References Cited

U.S. PATENT DOCUMENTS 4,107,671 A * 8/1978 Huntington et al. ........ 341/118
5,877,719 A * 3/1999 Matsui et al. ............... 341/155
6,054,945 A   4/2000 Doyle
6,060,914 A   5/2000 Nunokawa
6,433,727 B1  8/2002 Yoshinaga
6,867,723 B1  3/2005 Tachibana et al.

FOREIGN PATENT DOCUMENTS

JP           7-193503 A       7/1995

* cited by examiner

*Primary Examiner*—Jean Bruner Jeanglaude
(74) *Attorney, Agent, or Firm*—McDermott Will & Emery LLP

(57) ABSTRACT

An A/D converter of an successive approximation type according to the present invention comprises a sample hold circuit, a reference voltage generating circuit, a comparator for comparing the reference voltage generated by the reference voltage generating circuit to a value of the input analog signal retained in the sample hold circuit, a control circuit for successively controlling the reference voltage generating circuit so that a value of the reference voltage approximates to the value of the input analog signal retained in the sample hold circuit, a buffering circuit for outputting an output value corresponding to an output voltage of the comparator, a latch circuit for retaining the output value of the buffering circuit corresponding to the output value of the comparator per bit as a digital value, and a buffering control circuit for blocking a power supply to the buffering circuit during the sampling period is provided.

13 Claims, 11 Drawing Sheets

F I G. 1
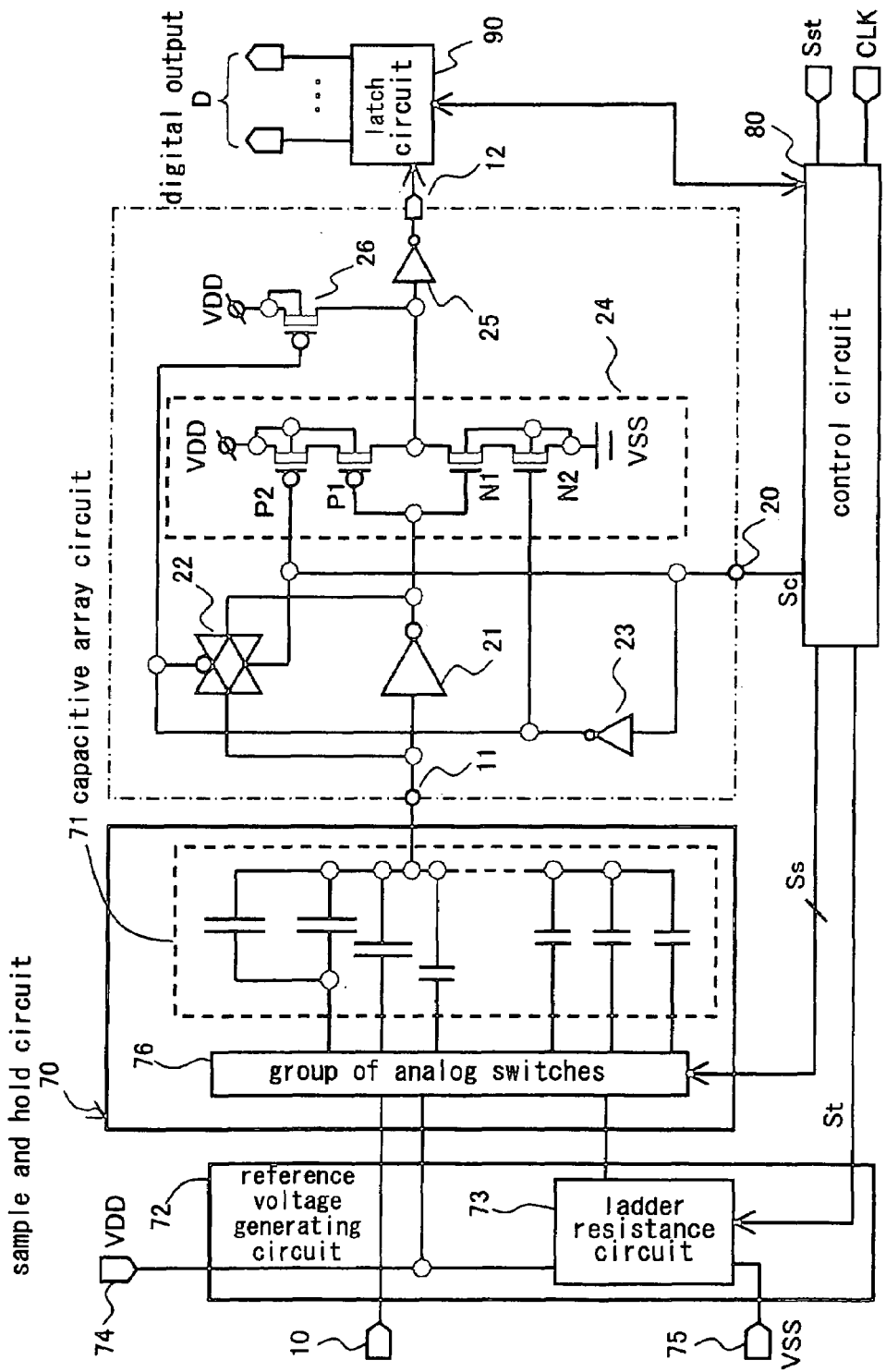

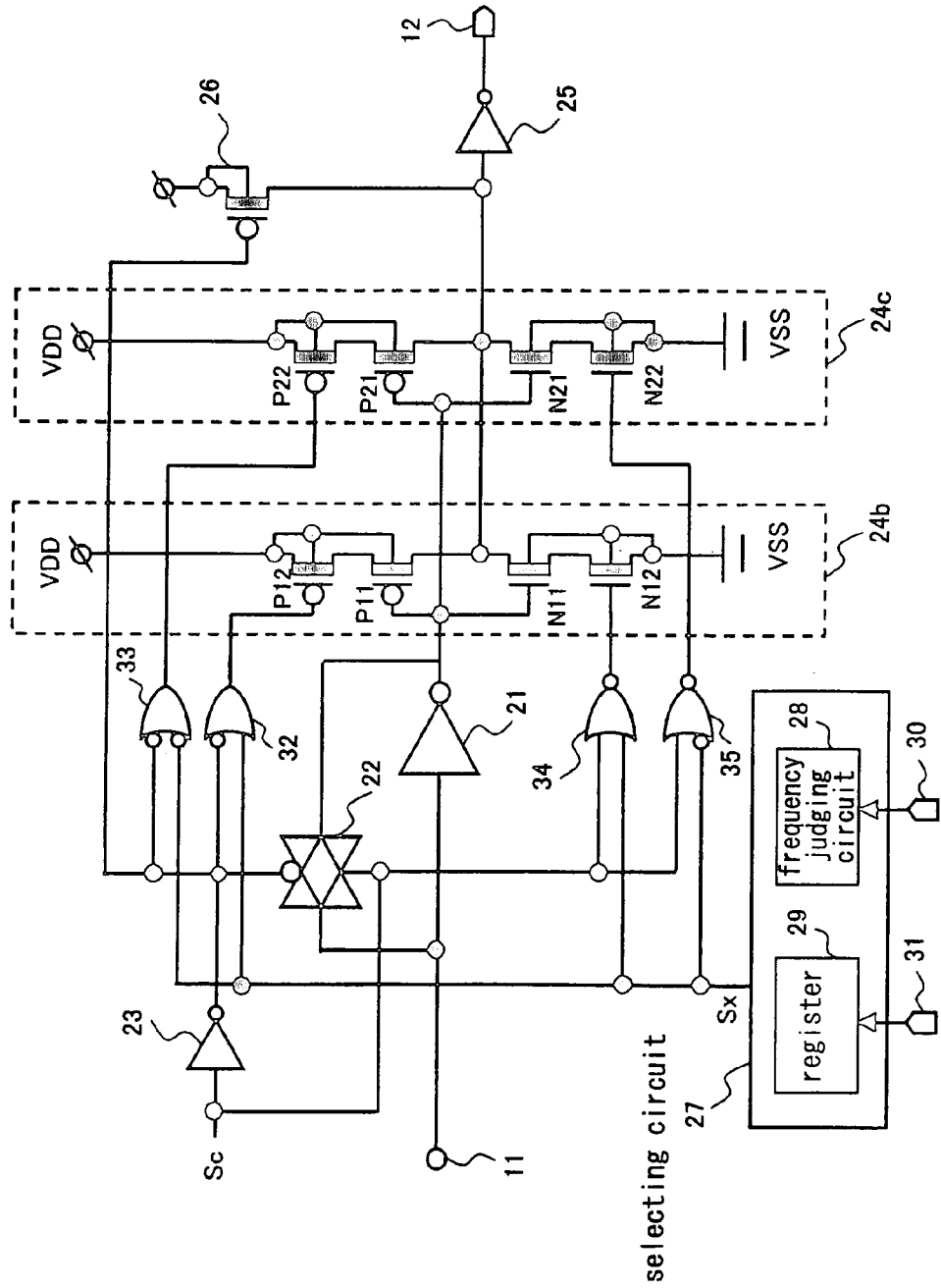
F I G. 4

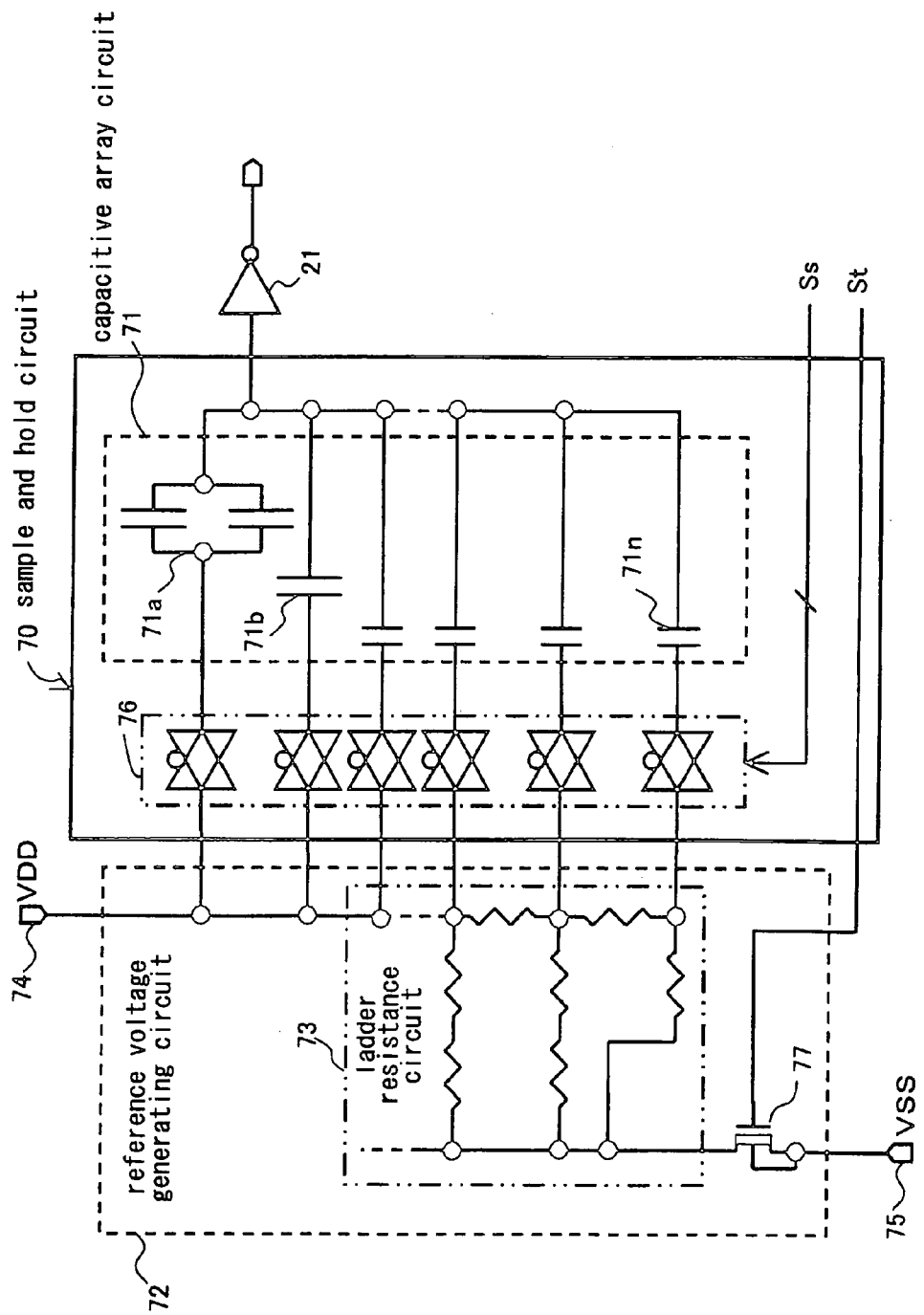

F I G. 1 0
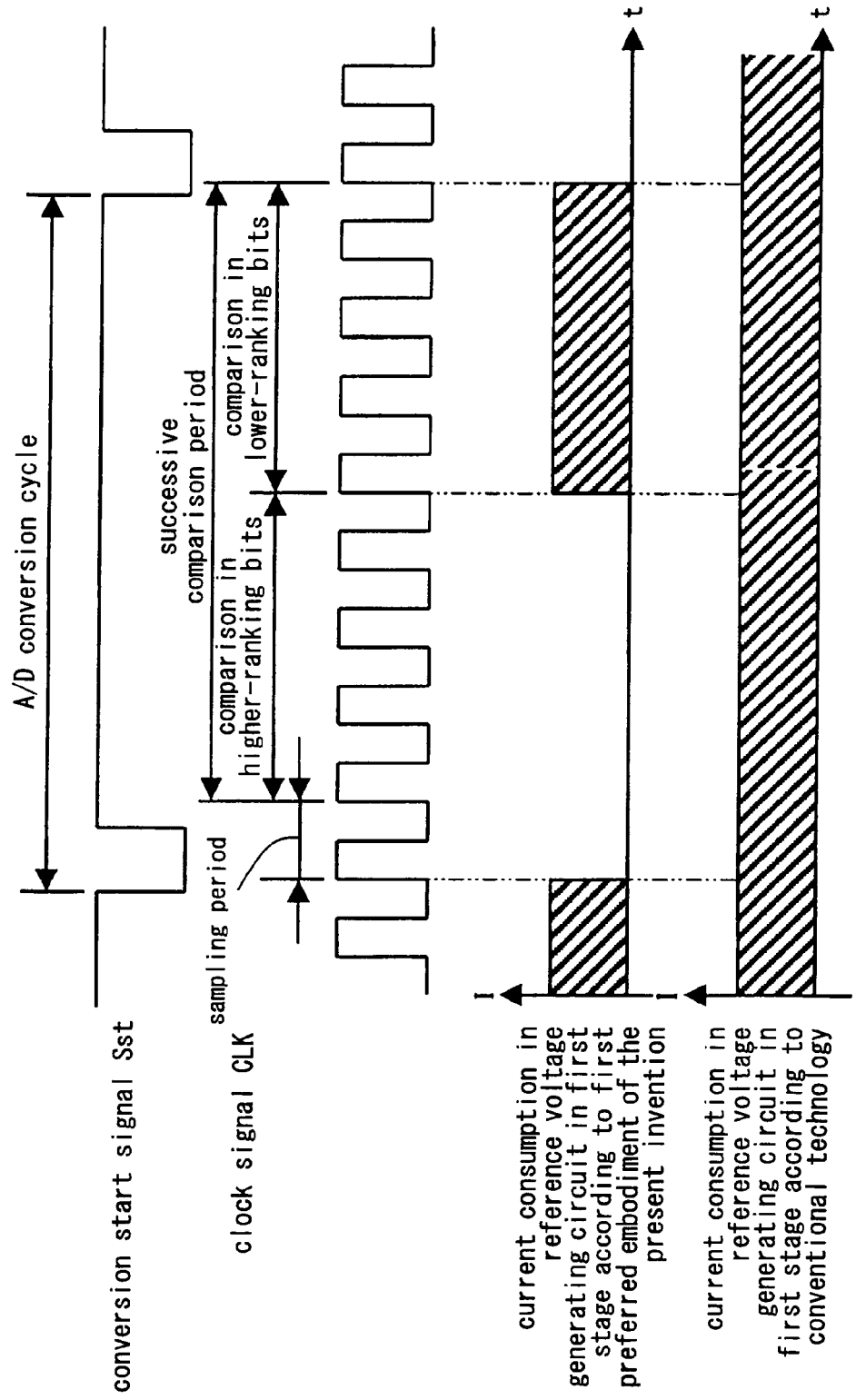

SUCCESSIVE APPROXIMATION TYPE A/D CONVERTER

FIELD OF THE INVENTION

The present invention relates to an A/D converter of an successive approximation type for converting an analog signal into a digital signal, which is useful in an application to a system LSI core and an analog LSI core in order to reduce power consumption.

BACKGROUND OF THE INVENTION

An A/D converter of an successive approximation type is a kind of an A/D converter for quantizing an analog signal. The successive approximation type A/D converter successively (per bit) compares an analog potential of an inputted analog signal to a variable reference voltage, and successively changes the reference voltage so that the reference voltage approximates to a voltage level of the inputted analog signal in accordance with a result of the comparison successively to thereby obtain the digital signal as an output result (for example, see No. H07-193503 of the Publication of the Unexamined Japanese Patent Applications (Page 3-4 and FIGS. 1-2).

FIG. 11 is a circuit diagram illustrating a configuration of a conventional successive approximation type A/D converter. Referring to reference numerals shown in the drawing, 10 denotes an analog input terminal, 21 denotes a comparator of a chopper type, 22 denotes an analog switch for short-circuiting input and output terminals of the comparator 21, 23 denotes a control inverter for controlling ON/OFF of the analog switch 22, 24 denotes an inverter for buffering in a first stage, 25 denotes an inverter in a second stage, 70 denotes a sample hold circuit, 71 denotes a capacitance array circuit, 72 denotes a reference voltage generating circuit, 73 denotes a ladder resistance circuit, 74 denotes a high-potential side reference power supply VDD, 75 denotes a low-potential side reference power supply VSS, 76 denotes a group of analog switches, 80 denotes a control circuit, and 90 denotes a latch circuit.

In a sampling period, a control signal Sc from the control circuit 80 is set to "H" level so that the analog switch 22 is turned on. Then, the input and output terminals of the comparator 21 are short-circuited, and a voltage value of half a full-scale voltage which is able to be converted by A/D converter (½ VDD) is generated. In response to the voltage, the capacitance array circuit 71 charges all of capacitances thereof using a potential difference between the ½ VDD and a voltage level of an analog signal inputted from the analog input terminal 10 and holds as an electric charge. Next, in a successive comparison period, the analog switch 22 is turned off, and the comparator 21 is operated as a comparator for inputting a voltage from the capacitance array circuit 71 so that a value of an input analog signal held in the capacitance array circuit 71 is compared to an output voltage level of the reference voltage generating circuit 72. When the voltage level of the input analog signal is higher than the output voltage level, an output value of the comparator 21 is buffered in two inverters 24 and 25, and a reference voltage value is held at a high potential with a first bit (MSB) of a digital output being set to "1". When the voltage level of the input analog signal is lower than the reference voltage, and the first bit of the digital output is set to "0" to return the reference voltage value to zero again. The digital output of the comparator 21 is retained as a digital value in the latch circuit 90.

When the foregoing operation is repeated until a value of a n'th bit is determined, a quantized data of the input analog signal is obtained as the digital output of n bits.

Further, the capacitance array circuit 71 is used, that holds the inputted analog values as the electric charge, and weighting corresponding to a context of the respective bits is adjusted based on the output voltage level of the reference voltage generating circuit 72 and capacitance value. In the bits where the weighting is adjusted based on the output voltage level of the reference voltage generating circuit 72, a voltage ½ VDD, ¼ VDD, ⅛ VDD, . . . , or 1/N VDD (N is a bit number weighted by the reference power supply) corresponding to approximately ½, ¼, ⅛, . . . or 1/N of the full-scale value, or 0, is added to the output voltage level of the reference voltage generating circuit 72 in the relevant bit for comparison. As a result of the comparison, when the voltage level of the input analog signal is higher than the reference voltage, the digital output is set to "1". When the voltage level of the input analog signal is lower than the reference voltage, the digital output is set to "0", and the reference voltage value is returned to zero again.

When the group of analog switches 76 are controlled by a timing signal Ss from the control circuit 80 and a voltage voltage-divided by the ladder resistance circuit 73 is connected to a capacitance of the relevant bit in the capacitance array circuit 71, the reference voltage can be changed.

There is a problem in the sampling period, however, that is, the ½ VDD, which is an intermediate voltage, generated in the comparator 21 of the chopper type is loaded to a gate of the buffering inverter 24, and current consumption is excessively increased due to a through current flowing in the inverter 24 and the subsequent circuits.

Further, a current flow is constantly supplied to the ladder resistance circuit 73 in the reference voltage generating circuit 72, which also increases the current consumption.

In the case of providing an A/D converter in an LSI such as a microcomputer, the A/D converter is often operated by clocks of a plurality of frequencies, in this case a comparator with a high performance is used to realize a normal operation at a highest operation speed. However, when the A/D converter is operated by a clock of a low frequency, the performance of the comparator becomes excessive, which largely increases the current consumption.

SUMMARY OF THE INVENTION

Therefore, a main object of the present invention is to reduce current consumption in an A/D converter of an successive approximation type.

An A/D converter of an successive approximation type according to the present invention comprises:
  a sample hold circuit for retaining an input analog signal during a sampling period;
  a reference voltage generating circuit for generating a reference voltage compared to the retained input analog signal during a successive comparison period;
  a comparator for comparing the reference voltage generated by the reference voltage generating circuit to a value of the input analog signal retained in the sample hold circuit;
  a control circuit for successively controlling the reference voltage generating circuit so that a value of the reference voltage approximates to the value of the input analog signal retained in the sample hold circuit based on an output value of the comparator per bit;
  a buffering circuit for outputting an output value corresponding to an output voltage of the comparator; and a latch circuit for retaining the output value of the buffering circuit corresponding to the output value of the comparator per bit as a digital value, wherein a buffering control circuit for blocking a power supply to the buffering circuit during the sampling period is provided.

In the foregoing structure, the comparator generates an intermediate voltage that is substantially half a full-scale voltage during the sampling period. At the time, the buffering control circuit blocks the power supply to the buffering circuit outputted from the comparator, and the buffering circuit is thereby in a non-operable state. Therefore, no through current flows in the buffering circuit even if the intermediate voltage outputted from the comparator is loaded to the buffering circuit during the sampling period.

As a preferable embodiment of the foregoing configuration, the buffering circuit is consisted of an inverter of a tri-state type, and the buffering control circuit is constructed to turn off a control transistor of the tri-state inverter during the sampling period and turn on the control transistor of the tri-state inverter during the successive comparison period.

According to the foregoing configuration, the control transistor of the tri-state inverter (buffering circuit) is turned off during the sampling period, and the buffering circuit is thereby in the non-operable state. Therefore, no through current flows in the buffering circuit even if the intermediate voltage outputted from the comparator is loaded to the buffering circuit during the sampling period. On the contrary, the control transistor of the tri-state inverter (buffering circuit) is turned on during the successive comparison period so that the output of the comparator is buffered and simultaneously transmitted to a following stage to be digitalized.

As another preferable embodiment of the foregoing configuration, an inverter for buffering is further connected to a subsequent stage of the tri-state inverter constituting the buffering circuit, a pull-up circuit is connected to a connection point of the tri-state inverter and the buffering inverter, and the buffering control circuit is constructed to turn off the control transistor of the tri-state inverter and turn on the pull-up circuit during the sampling period, and turn on the control transistor of the tri-state inverter and turn off the pull-up circuit during the successive comparison period.

According to the foregoing configuration, when the tri-state inverter (buffering circuit) is made non-operable during the sampling period, the pull-up circuit is operated at the same time so that the buffering output can be stabilized. Another advantage is that the flow of the through current can be prevented, not only in the tri-state inverter (buffering circuit), but also in the buffering inverter subsequent thereto.

As still another preferable embodiment of the foregoing configuration, a first buffering circuit with a first performance and a second buffering circuit with a second performance are provided as the buffering circuit, and a select circuit for selecting one of the first and second buffering circuits is provided, wherein the buffering control circuit blocks the power supply to the buffering circuit selected by the select circuit during the sampling period, while always blocking the power supply to the buffering circuit not selected by the select circuit.

In the foregoing configuration, the first buffering circuit with the higher performance is selected when a high frequency is used as a frequency of an operation clock of the A/D converter, thereby the output of the comparator can be correctly transmitted at a high speed though the current consumption is increased. When a low frequency is used, the second buffering circuit with the lower performance is selected so that the current consumption can be reduced.

More specifically, the performance of the buffering circuit is selected in accordance with the clock frequency, the current consumption, which may be increased when the performance of the buffering circuit is excessive, can be prevented without lowering an accuracy and a conversion cycle of the A/D converter.

As still another preferable embodiment of the foregoing configuration, the following is given.

a first comparator with a first performance and a second comparator with a second performance are provided as the comparator, and a select circuit for selecting one of the first and second comparators is provided, wherein the select circuit always supplies the power supply to the selected comparator, while always blocking the power supply to the comparator not selected.

In the foregoing configuration, the first comparator with the higher performance is selected when a high frequency is used as the frequency of the operation clock of the A/D converter, thereby the output of the comparator can be correctly transmitted at a high speed though the current consumption is increased. When a low frequency is used, the second comparator with the lower performance is selected so that the current consumption can be reduced. More specifically, the performance of the comparator is selected in accordance with the clock frequency, the current consumption, which may be increased when the performance of the comparator is excessive, can be prevented without lowering the accuracy and the conversion cycle of the A/D converter.

As still another preferable embodiment of the foregoing configuration, a first buffering circuit with a first performance and a second buffering circuit with a second performance are provided as the buffering circuit, a first comparator with a first performance and a second comparator with a second performance are provided as the comparator, and a select circuit for selecting one of the first and second comparators and selecting one of the first and second buffering circuits is provided, wherein the buffering control circuit blocks the power supply to the buffering circuit selected by the select circuit during the sampling period, while always blocking the power supply to the buffering circuit not selected by the select circuit, and the select circuit supplies the power supply to the selected comparator, while always blocking the power supply to the comparator not selected.

The select circuit may be constructed either to be controlled in accordance with the clock frequency or controlled in accordance with a register value externally set.

An A/D converter of an successive approximation type according to the present invention comprises:

a sample hold circuit for retaining an input analog signal during a sampling period;

a reference voltage generating circuit for generating a reference voltage compared to the retained input analog signal during a successive comparison period;

a comparator for comparing the reference voltage generated by the reference voltage generating circuit to a value of the input analog signal retained in the sample hold circuit;

a control circuit for successively controlling the reference voltage generating circuit so that a value of the reference voltage approximates to the value of the input analog signal retained in the sample hold circuit based on an output value of the comparator per bit;

a buffering circuit for outputting an output value corresponding to an output voltage of the comparator; and a latch circuit for retaining the output value of the buffering circuit corresponding to the output value of the comparator per bit as a digital value, wherein a circuit for stopping the operation of the reference voltage generating circuit is provided in the reference voltage generating circuit so that the reference voltage generating circuit is stopped during a period when the supply of the reference voltage is unnecessary in the sampling period or a period when a voltage externally inputted is used as the reference voltage in the successive comparison period.

According to the foregoing configuration, the generation of the reference voltage can be limited to a necessary minimum level, and the current consumption can be thereby largely reduced.

BRIEF DESCRIPTION OF THE DRAWINGS

These and other objects as well as advantages of the invention will become clear by the following description of preferred embodiments of the invention. A number of benefits not recited in this specification will come to the attention of the skilled in the art upon the implementation of the present invention.

FIG. 1 is a circuit diagram illustrating a configuration of an A/D converter of an successive approximation type according to a first preferred embodiment of the present invention.

FIG. 4 is a circuit diagram illustrating a configuration of a main part (current consumption countermeasure circuit) of an A/D converter of an successive approximation type according to a third preferred embodiment of the present invention.

FIG. 9 is a circuit diagram illustrating a configuration of a main part (sample hold circuit) of an A/D converter of an successive approximation type according to a sixth preferred embodiment of the present invention.

FIG. 10 is a timing chart of an operation of the A/D converter of the successive approximation type according to the sixth preferred embodiment.

DETAILED DESCRIPTION OF PREFERRED EMBODIMENTS

Figure 2:
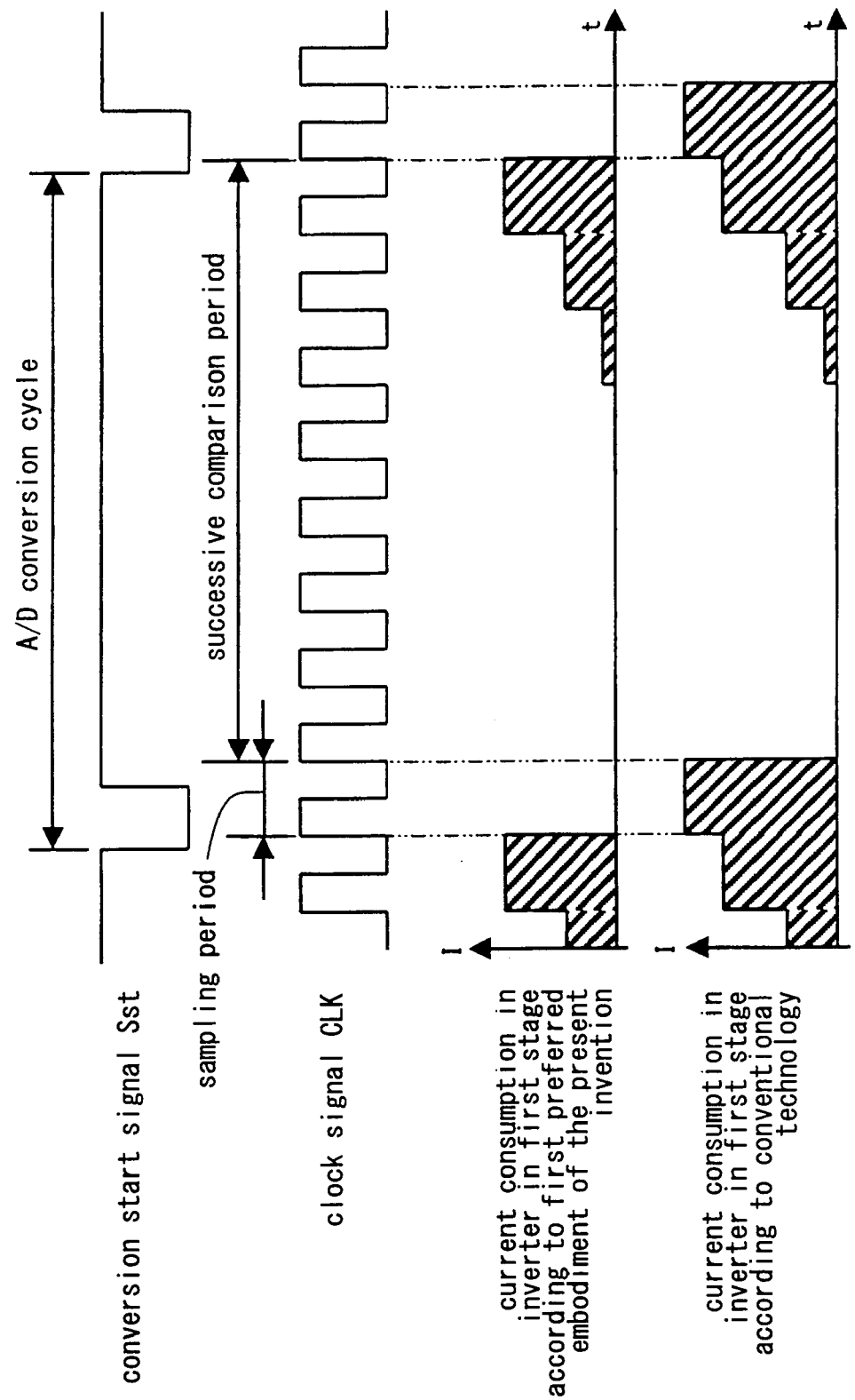
FIG. 2 is a timing chart of an operation of the A/D converter of the successive approximation type according to the first preferred embodiment.

Hereinafter, preferred embodiments of the present invention are described referring to the drawings.

First Preferred Embodiment

FIG. 1 is a circuit diagram illustrating a configuration of an A/D converter of an successive approximation type according to a first preferred embodiment of the present invention.

Referring to reference numerals shown in FIG. 1, 10 denotes an analog input terminal, 11 denotes an analog value input/output terminal for outputting an intermediate voltage of ½ VDD generated in a comparator 21 of a chopper type during a sampling period to a capacitance array circuit 71, the analog value input/output terminal further serving for analog input in a comparing operation, 12 denotes a digital output terminal for buffering an analog value outputted by the comparator 21 in the comparing operation and outputting the buffered analog value as a digital value, 21 denotes the comparator of the chopper type, 22 denotes an analog switch (transmission gate) controlled by a control signal Sc inputted thereto from a control circuit 80 for receiving an inputted clock via a control input terminal 20, 23 denotes an inverter for control, 24 denotes an inverter for buffering in a first stage, 25 denotes an inverter for buffering in a second stage, 26 denotes a pull-up circuit, 70 denotes a sample hold circuit, 71 denotes a capacitance array circuit, 72 denotes a reference voltage generating circuit, 73 denotes a ladder resistance circuit, 74 denotes a high-potential side reference power supply VDD, and 75 denotes a low-potential side reference power supply VSS.

The analog value input/output terminal 11 is connected to an input terminal of the comparator 21 and the capacitance array circuit 71. An output terminal of the comparator 21 is connected to an input terminal of the buffering inverter 24 in the first stage. An input terminal of the control inverter 23 is connected to the control input terminal 20. The analog switch 22 is connected in parallel to the comparator 21. An NMOS control terminal of the analog switch 22 is connected to the control input terminal 20, and a PMOS control terminal thereof is connected to an output terminal of the control inverter 23.

In the inverter 24 in the first stage, two Pch transistors P2 and P1 and two Nch transistors N1 and N2 are respectively connected in series. The Pch transistor P1 and the Nch transistor N1 constitutes the inverter. The output terminal of the comparator 21 is connected to a gate of the Pch transistor P1 and a gate of the Nch transistor N1. The Pch transistor (control transistor) P2 is inserted between the Pch transistor P1 and the reference power supply VDD on the high-potential side. The control input terminal 20 is connected to a gate of the Pch transistor P2. The Nch transistor (control transistor) N2 is inserted between the Nch transistor N1 and the low-potential side reference power supply VSS. The output terminal of the control inverter 23 is connected to a gate of the Nch transistor N2. The foregoing configuration constitutes a buffering control circuit.

A drain of the Pch transistor P1 and a drain of the Nch transistor N1 are connected to each other, which serves as an output terminal of the inverter 24 in the first stage. The output terminal of the inverter 24 in the first stage is connected to an input terminal of the buffering inverter 25 in the second stage. The digital output terminal 12 is connected to an output terminal of the inverter 25 in the second stage.

The pull-up circuit 26 is connected to the output terminal of the inverter 24 in the first stage, in other words, the input terminal of the inverter 25 in the second stage. A Pch transistor constitutes the pull-up circuit 26, whose source is connected to the reference power supply VDD on the high-potential side, drain is connected to the input terminal of the inverter 25 in the second stage, and gate is connected to the output terminal of the control inverter 23. The digital output terminal 12 is connected to a latch circuit 90 of n bits. The latch circuit 90 outputs a digital data of n bits.

Next description is given to an operation of the A/D converter of the successive approximation type according to the present preferred embodiment thus configured referring to a timing chart shown in FIG. 2.

The control circuit 80, to which a clock signal CLK and a conversion start signal Sst is inputted, performs timing control of the A/D converter of the successive approximation type. The operation shifts to the sampling period when the conversion start signal Sst falls to "L" level. Then, the control signal Sc from the control circuit 80 turns to "H" level, and the analog switch 22 is turned on. The Pch transistor P2 and the Nch transistor N2 of the inverter 24 in the first stage are both turned off, and the pull-up circuit 26 is turned on. The comparator 21 of the chopper type whose input terminal and output terminal are short-circuited generates the intermediate voltage (½ VDD) which is half a full-scale VDD of A/D conversion when the analog switch 22 is turned on, and loads the generated intermediate voltage to the analog value input/output terminal 11. In the capacitance array circuit 71, a potential difference between the intermediate voltage of ½ VDD and a voltage level of an input analog signal loaded to the analog input terminal 10 is used so that all of capacitances are charged, and the voltage level of the input analog signal is held as an electric charge.

In the sampling period, the intermediate period of ½ VDD is loaded to the gates of the Pch transistor P1 and the Nch transistor N1 of the inverter 24 in the first stage. However, because the Pch transistor P2 and the Nch transistor N2 are switched to OFF and the inverter 24 in the first stage is thereby in a non-operable state, no through current flows in the inverter 24 in the first stage. The pull-up circuit 26 is ON, and the reference power supply VDD on the high-potential side is loaded to the input terminal of the buffering inverter 25 in the second stage. Accordingly, the digital output terminal 12 is always at the "L" level in the sampling period. As a result, the inverter 25 in the second stage and the latch circuit 90 maintain their stability.

Next, when the control signal Sc is switched to the "L" level, the operation shifts to a successive comparison period. Then, the analog switch 22 is turned off, the Pch transistor P2 and the Nch transistor N2 of the inverter 24 in the first stage are turned on, and the pull-up circuit 26 is turned off. The comparator 21 of the chopper type operates as a comparator for inputting the voltage from the capacitance array circuit 71. The control circuit 80 controls the reference voltage generating circuit 72 to thereby supply an optimal reference voltage to the comparator 21 per bit. When the voltage level of the input analog signal is higher than a voltage of half the reference voltage, the output of the comparator 21 turns to the "H" level. The output at the "H" level is buffered in the inverter 24 in the first stage and the inverter 25 in the second stage, and transmitted as the "H" level from the digital output terminal 12 to the latch circuit 90. Then, a data "1" is latched in the latch circuit 90 as a first bit (MSB) of the digital output. At the time, the reference voltage value is held. When the voltage level of the input analog signal is lower than the voltage of half the reference voltage, a data "0" is latched as the first bit (MSB) of the digital output. Then, the reference voltage value is made to return zero. Next, the control circuit 80 controls the reference voltage generating circuit 72 to thereby add a voltage corresponding to approximately ¼ of a full-scale value of the input analog signal to the reference voltage. When the voltage level of the input analog signal is higher than the reference voltage resulting from the addition, the output of the comparator 21 turns to the "H" level, and the data "1" is latched as a second bit of the digital output. At the time, the value of reference voltage after addition is held. When the voltage level of the input analog signal is lower than the reference voltage, the data "0" is latched as the second bit of the digital output. At the time, the value of reference voltage after addition is reset to the reference voltage before the addition. The foregoing operation is repeated until a value of an n'th bit is determined. As a result, the digital output of n bits can be obtained from the latch circuit 90.

In the successive comparison period, an output signal based on a comparison result from the comparator 21 becomes a very small level. The inverter 24 in the first stage is consisted of a tri-state type, where a circuit configuration is made relatively simple due to structure of transistor, and any possible influence on variability and precision can be controlled to minimum. As a result, the inputted signal can be accurately amplified in the inverter 24 in the first stage.

Figure 11:
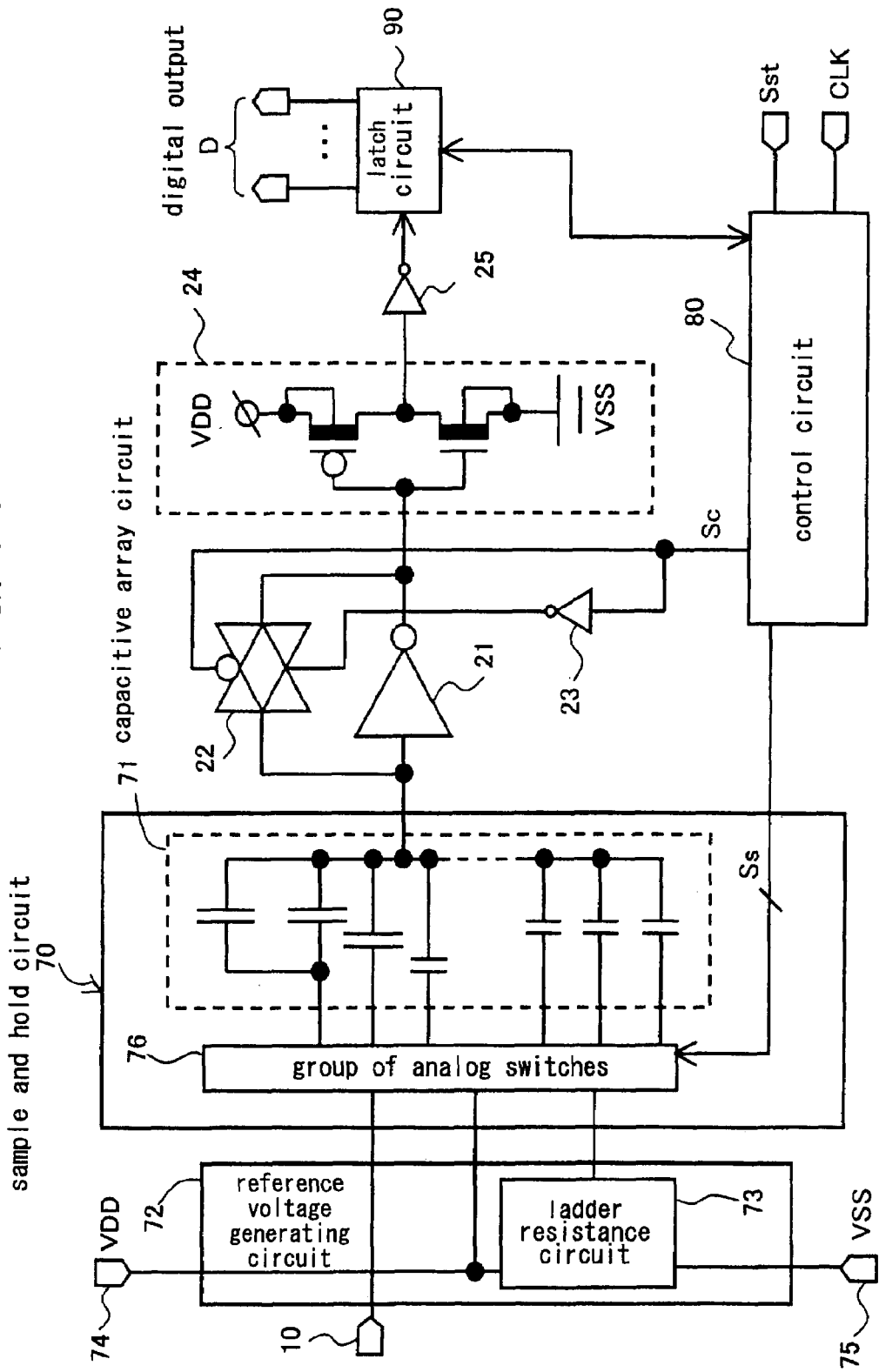
FIG. 11 is a circuit diagram illustrating a configuration of an A/D converter of an successive approximation type according to a conventional technology.

As shown in FIG. 2, the current consumption in the buffering inverter 24 in the first stage is zero during the sampling period in the present preferred embodiment, which proves that the current consumption is favorably reduced in comparison to the conventional technology shown in FIG. 11.

Second Preferred Embodiment

Figure 3:
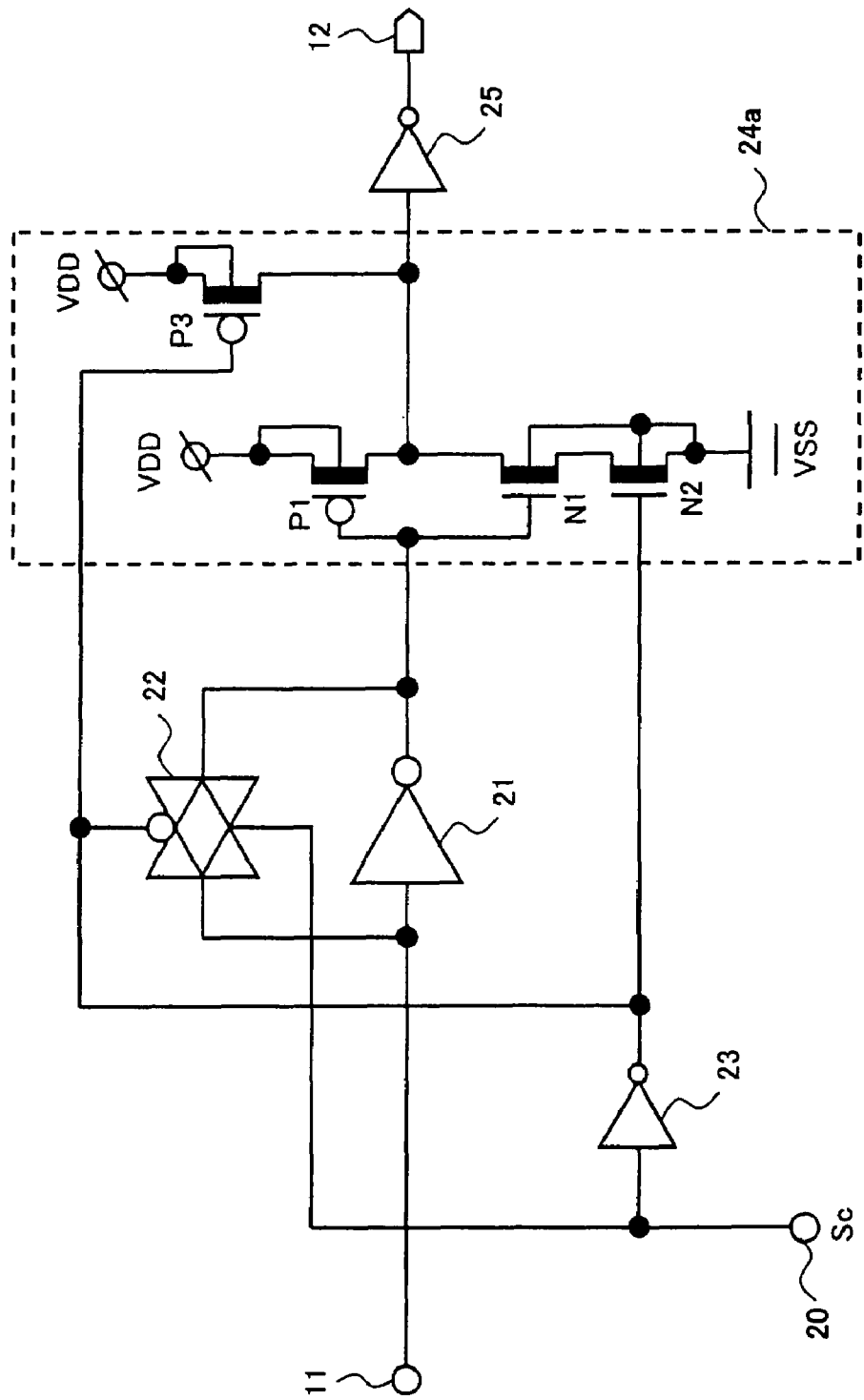
FIG. 3 is a circuit diagram illustrating a configuration of a main part (current consumption countermeasure circuit) of an A/D converter of an successive approximation type according to a second preferred embodiment of the present invention.

FIG. 3 is a circuit diagram illustrating a configuration of a main part (current consumption countermeasure circuit) of an A/D converter of an successive approximation type according to a second preferred embodiment of the present invention. Any component shown in FIG. 3 provided with the same reference numeral as shown in FIG. 1 according to the first preferred embodiment is similarly configured and not described below again. In the present preferred embodiment, an inverter 24a for buffering in a first stage in which a NAND-type logic is adopted. The pull-up circuit is omitted. The inverter 24a of the NAND type in the first stage also serves as the pull-up circuit.

In the sampling period, the "H" level is loaded to the control input terminal 20, and the "L" level is outputted from the control inverter 23. Thereby, the analog switch 22 is turned on, the Nch transistor N2 is turned off, and the Pch transistor P3 is turned on. As a result, the output of the inverter 24a in the first stage is at the "H" level, and the output of the inverter 25 in the second stage is at the "L" level. Because the analog switch 22 is turned on, the comparator 21 generates the intermediate voltage of ½ VDD. Since the Nch transistor N2 is always OFF during the sampling period, the through current can be prevented even though the intermediate voltage is loaded to an input gate of the inverter 24a in the first stage.

Further, the buffering inverter 24a in the first stage is consisted of the NAND type, which eventually includes the pull-up circuit. Therefore, it becomes unnecessary to provide the pull-up circuit in order to stabilize the circuits subsequent to the inverter 24a in the first stage. The circuit can be made of a fewer number of transistors in comparison to the first preferred embodiment, which can be made an equipment much smaller-sized.

Third Preferred Embodiment

FIG. 4 is a circuit diagram illustrating a configuration of a main part (current consumption countermeasure circuit) of an A/D converter of an successive approximation type according to a third preferred embodiment of the present invention. Any component shown in FIG. 4 provided with the same reference numeral as shown in FIG. 1 according to the first preferred embodiment is similarly configured and not described below again. In the present preferred embodiment, two inverters, which are an inverter 24b with a first performance in a first stage and an inverter 24c with a second performance in a first stage, are used as the buffering inverter of the tri-state type in the first stage so that the two inverters are switched depending on conditions. The first performance is higher than the second performance. The inverter 24b with the first performance and the inverter 24c with the second performance are connected in parallel to each other between the comparator 21 and the inverter 25 in the second stage.

A reference numeral 27 denotes a select circuit in a microcomputer or LSI in which the A/D converter is installed. A reference numeral 28 denotes a frequency judging circuit for selecting an optimal size of the buffering inverter to be used from the inputted clock signal CLK. A reference numeral 29 denotes an internal register, 30 denotes a clock input terminal, and 31 denotes an external input terminal capable of setting up by software to the register 29. The select circuit 27 activates one of the inverter 24b with the first performance and the inverter 24c with the second performance based on a selection signal Sx corresponding to a judgment result of the frequency judging circuit 28 or a set value of the register 29.

An output terminal of a logic circuit 32 for control in an OR gate is connected to a gate of a Pch transistor P12 in the inverter 24b with the first performance. An input terminal of the control logic circuit 32 on one end is connected to the output terminal of the control inverter 23 through logic inversions and the selection signal Sx is inputted to an input terminal of the control logic circuit 32 on the other end. An output terminal of a logic circuit 33 for control in an OR gate is connected to a gate of a Pch transistor P22 in the inverter 24c with the second performance. An input terminal of the control logic circuit 33 on one end is connected to the output terminal of the control inverter 23 through logic inversion, and the selection signal Sx is inputted to an input terminal of the control logic circuit 33 on another end through logic inversion.

Further, an output terminal of a logic circuit 34 for control in an OR gate is connected to a gate of an Nch transistor N12 in the inverter 24b with the first performance through logic inversion. An input terminal of the control logic circuit 34 on one end is connected to the output terminal of the control inverter 23, and the control signal Sc is inputted to an input terminal of the control logic circuit 34 on the other end. An output terminal of a logic circuit 35 for control in an OR gate is connected to a gate of an Nch transistor N22 in the inverter 24c with the second performance through logic inversion. The control signal Sc is inputted to the input terminal of the control logic circuit 35 on one end, and the selection signal Sc is inputted to an input terminal of the control logic circuit 35 on the other end through logic inversion.

In the case of the first and second preferred embodiments, the control signal Sc controls ON/OFF of the analog switch 22, pull-up circuit 26 and inverter 24 in the first stage. In the present preferred embodiment, the control signal Sc controls ON/OFF of the analog switch 22 and the pull-up circuit 26, while the selection signal Sx controls the selection of the inverter 24b with the first performance and the inverter 24c with the second performance.

Figure 5:
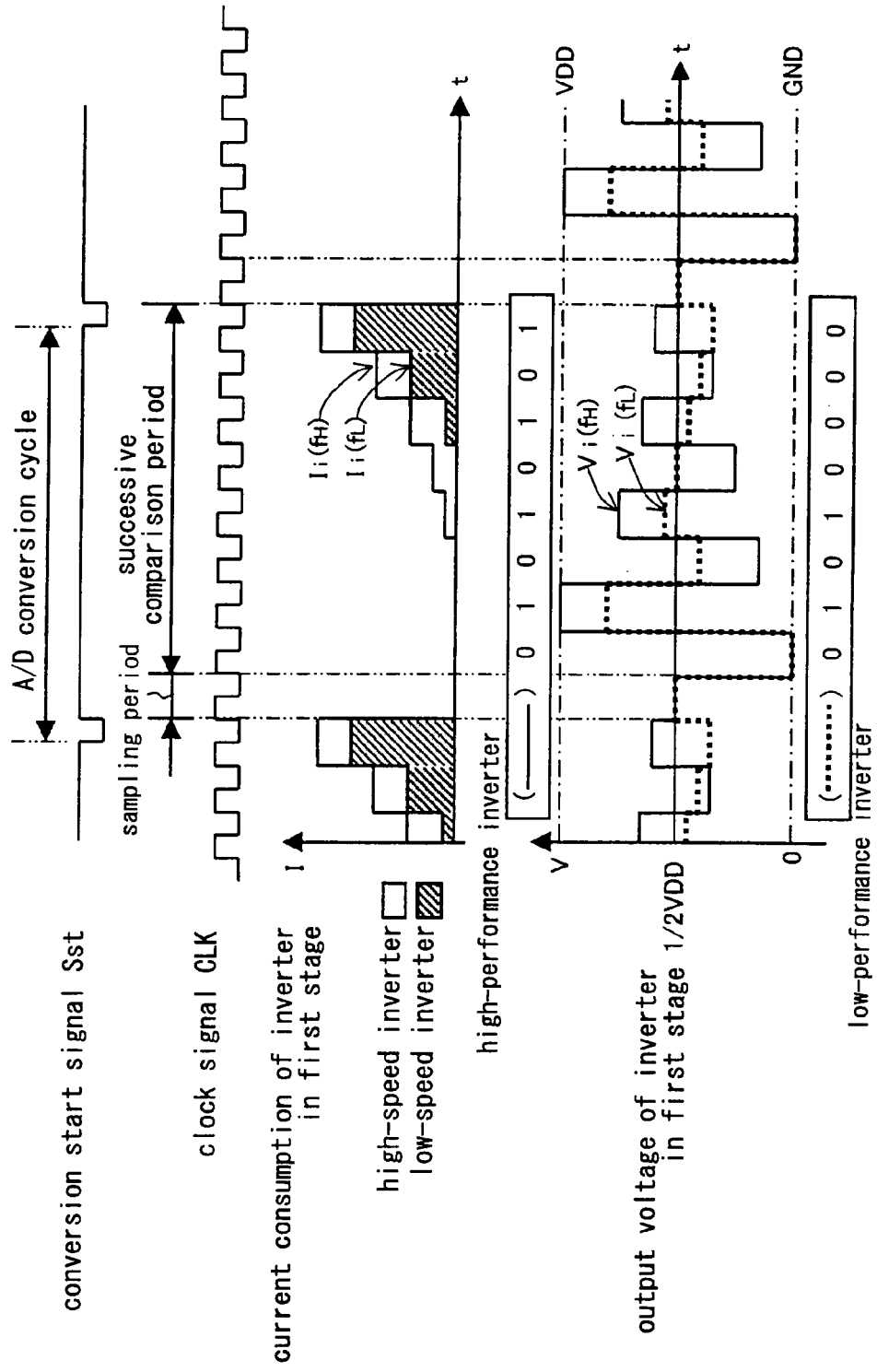
FIG. 5 is a timing chart of an operation of the A/D converter of the successive approximation type according to the third preferred embodiment.

Next description is given to an operation of the A/D converter of the successive approximation type according to the present preferred embodiment thus configured referring to a timing chart shown in FIG. 5. FIG. 5 shows a case where a frequency of the clock signal CLK is high.

Assuming that "10101010" is outputted from the comparator 21 in a chronological order, in the case that the clock signal CLK has a high frequency, the current consumption can be reduced when the inverter with the lower performance is used as the inverter in the first stage. However, an incorrect value such as "01010000" is outputted since the signal cannot be accurately transmitted. In contrast to that, when the inverter with the higher performance is used as the inverter in the first stage, the signal transmission can be accurate though the current consumption is increased. In the case that the clock signal CLK has a low frequency, the output can be correct irrespective of either of the inverters with the high performance and the low performance to be used. Therefore, the inverter with the lower performance is used so that the current consumption is reduced.

In the select circuit 27, one of the frequency judging circuit 28 and the register 29 is set to the activated state.

The frequency judging circuit 28 judges the frequency of the clock signal CLK from the clock input terminal 30 and outputs the "L" level as the selection signal Sx in case of any frequency higher than a reference level. When the selection signal Sx is at the "L" level, the "H" level, which is the logic inversion of the "L" level, is inputted to the control logic circuits 33 and 35. Thereby, the Pch transistor P22 and the Nch transistor N22 are always turned off irrespective of whether the logic levels of the other input terminals are at the "H" level or "L" level, and the inverter 24c with the second performance is not selected. When the selection signal Sx is at the "L" level, the inverter 24b with the first performance is selected.

When the control signal Sc turns to the "H" level and the operation shifts to the sampling period in the state where the inverter 24b with the first performance is selected, the Pch transistor P12 and the Nch transistor N11 are both turned off. Further, the pull-up circuit 26 is turned on, and the digital output terminal 12 is at the "L" level via the buffering inverter 25 in the second stage. The through current is prevented during the sampling period. When the control signal Sc turns to the "L" level and the operation shifts to the successive comparison period, the Pch transistor P12 and the Nch transistor N11 are both turned on. Further, the pull-up circuit 26 is turned off, and the output of the digital output terminal 12 is determined in response to the output level of the comparator 21 according to the voltage level of the input analog signal. The current consumption at the time is Ii (fH), and the transition of the output voltage of the inverter 24b with the first performance results in Vi (fH).

In the case that the clock signal CLK has any frequency lower than the reference level, the frequency judging circuit 28 outputs the "H" level as the control signal Sc. When the selection signal Sx is at the "H" level, the "H" level is directly inputted to the control logic circuits 32 and 34 without the logic inversion. Thereby, the Pch transistor P12 and the Nch transistor N11 are always turned off regardless of whether the logic levels of the other input terminals are at the "H" level or "L" level, and the inverter 24b with the first performance is not selected. When the selection signal Sx is at the "H" level, the inverter 24c with the second performance is selected.

When the control signal Sc turns to the "H" level and the operation shifts to the sampling period in the state where the inverter 24c with the second performance is selected, the Pch transistor P22 and the Nch transistor N22 are both turned off. Further, the pull-up circuit 26 is turned on, and the digital output terminal 12 is at the "L" level via the buffering inverter 25 in the second stage. The through current is prevented during the sampling period. When the control signal Sc turns to the "L" level and the operation shifts to the successive comparison period, the Pch transistor P22 and the Nch transistor N22 are both turned on. Further, the pull-up circuit 26 is turned off, and the output of the digital output terminal 12 is determined in response to the output level of the comparator 21 in accordance with the voltage level of the input analog signal. The current consumption at the time is Ii (fL), and the transition of the output voltage of the inverter 24c with the second performance results in Vi (fL).

The performance of the inverter in the first stage can be switched in the same manner when the register 29, in place of the frequency judging circuit 28, is activated so that the selection signal Sx is controlled by the set value of the register 29.

When the performance of the buffering circuit is appropriately switched in accordance with the frequency of the clock signal CLK as described, increase of the current consumption due to the excessive performance of the buffering circuit, can be prevented.

Fourth Preferred Embodiment

Figure 6:
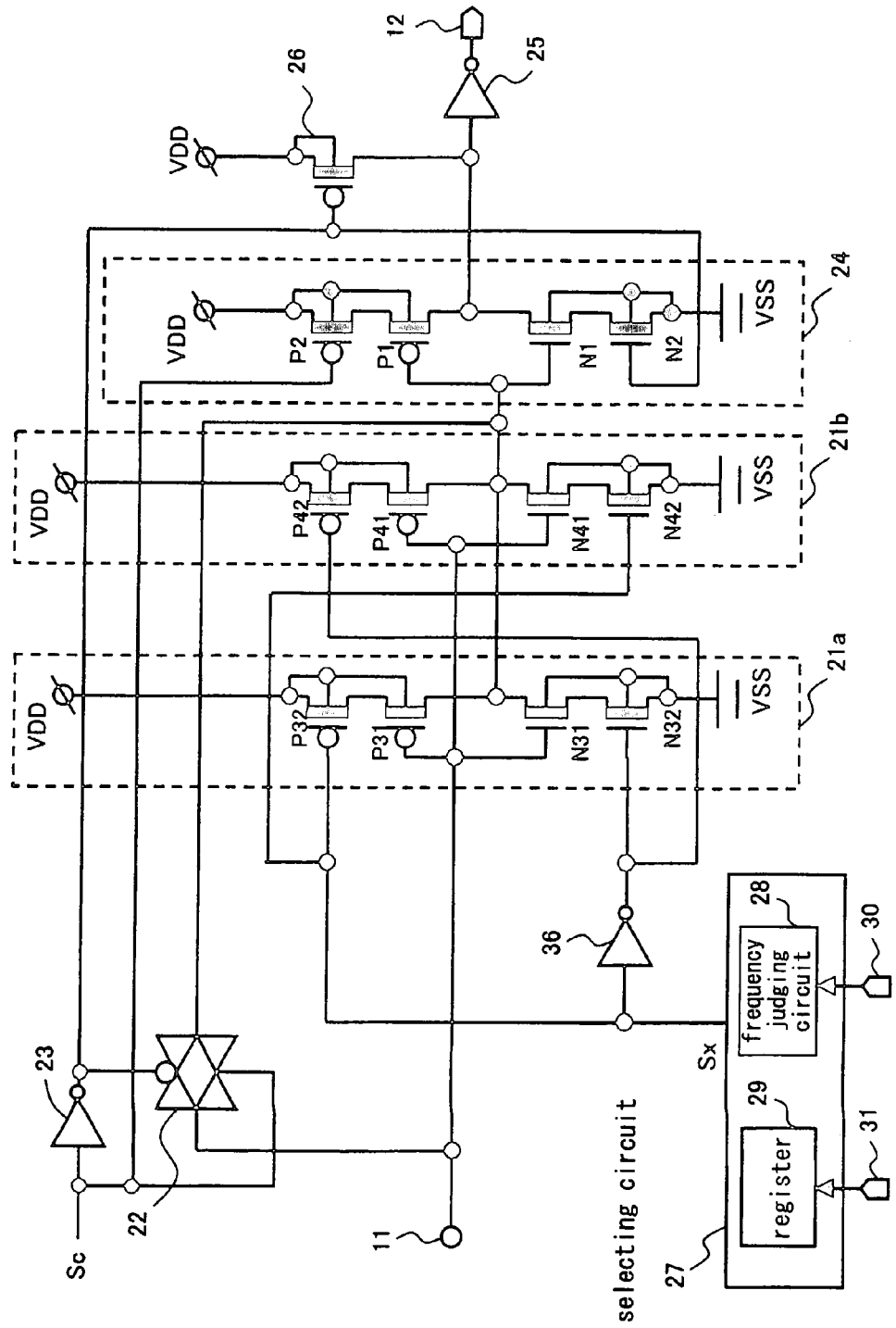
FIG. 6 is a circuit diagram illustrating a configuration of a main part (current consumption countermeasure circuit) of an A/D converter of an successive approximation type according to a fourth preferred embodiment of the present invention.

FIG. 6 is a circuit diagram illustrating a configuration of a main part (current consumption countermeasure circuit) of an A/D converter of an successive approximation type according to a fourth preferred embodiment of the present invention. Any component shown in FIG. 6 provided with the same reference numeral as shown in FIG. 1 according to the first preferred embodiment and FIG. 3 according to the third preferred embodiment is similarly configured and not described below again. In the present preferred embodiment, two comparators, which are a first comparator 21a comprising an inverter of a tri-state type with a first performance and a second comparator 21b comprising an inverter of a tri-state type with a second performance, are used as the comparator of the chopper type, and they are selectively switched depending on conditions. The first performance is higher than the second performance. The first comparator 21a and the second comparator 21b are connected in parallel to each other between the analog value input/output terminal 11 and the inverter 24 in the first stage. A reference numeral 36 denotes an inverter for control to select one of the first comparator 21a and the second comparator 21b based on the logic level of the selection signal Sx.

Figure 7:
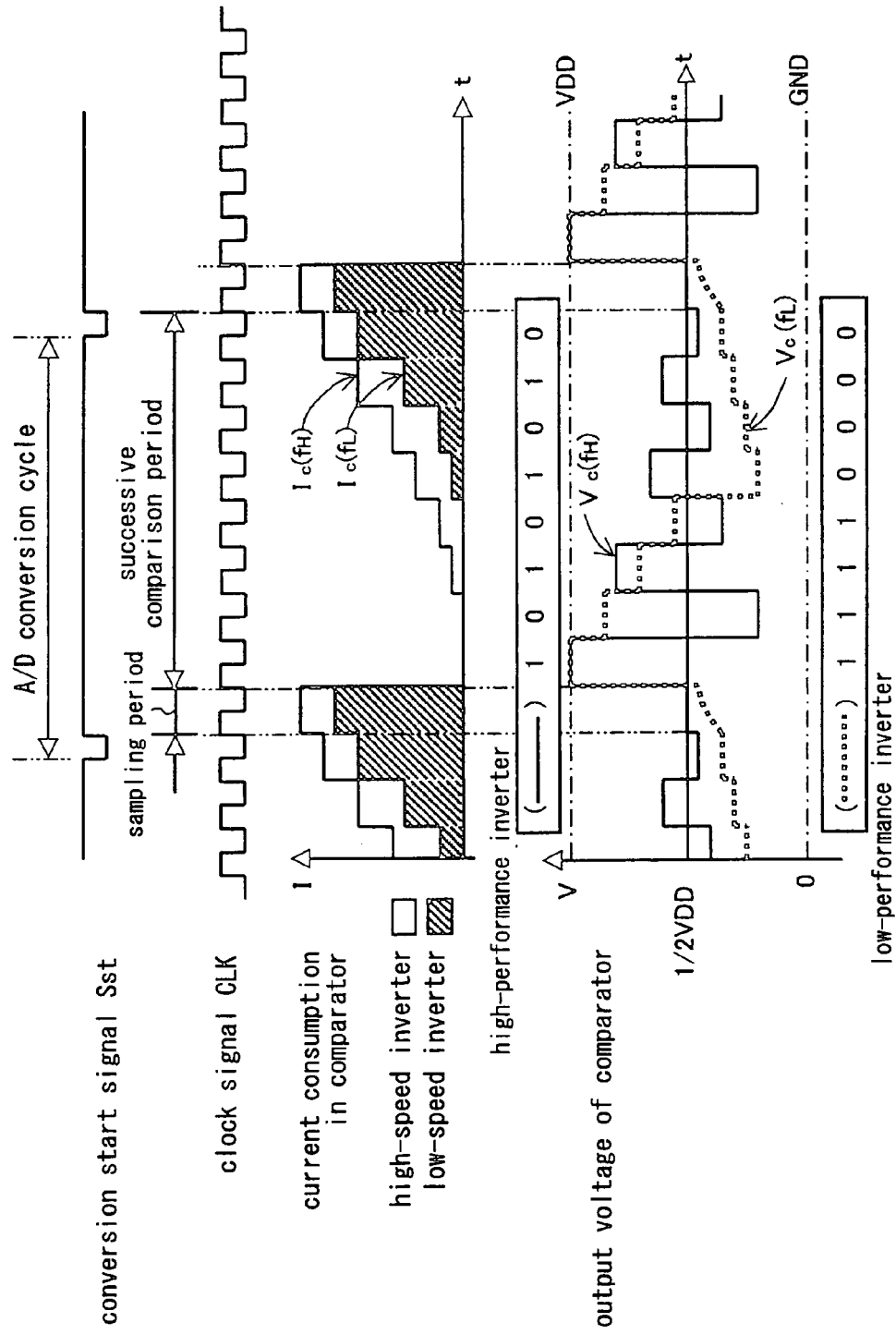
FIG. 7 is a timing chart of an operation of the A/D converter of the successive approximation type according to the fourth preferred embodiment.

Next is described an operation of the A/D converter of the successive approximation type according to the present preferred embodiment thus configured referring to a timing chart shown in FIG. 7. FIG. 7 shows a case where the frequency of the clock signal CLK is high.

Below is given an example in which an analog input signal equivalent to "10101010" is digitally converted as an ideal digital output value.

In the case that the clock signal CLK has a high frequency, the current consumption can be reduced when the comparator with the lower performance is used. However, the comparison to the reference power supply cannot be done accurately due to a poor drive performance of the comparator, and an incorrect comparison result such as "11110000" is outputted. In contrast to that, the current consumption is increased when the comparator with the higher performance is used, however, the signal transmission can be accurate. In the case that the clock signal CLK has a low frequency, the accurate output can be obtained whichever of the inverters with the high and low performances is used. Therefore, the inverter having the lower performance is used so that the current consumption is reduced.

In the select circuit 27, one of the frequency judging circuit 28 and the register 29 is set to the activated state.

The frequency judging circuit 28 judges the frequency of the clock signal CLK from the clock input terminal 30, and outputs the "L" level as the selection signal Sx in the case of any frequency higher than the reference level. A Pch transistor P32 and an Nch transistor N32 are turned on, and the first comparator 21a is in a state of switching. Further, a Pch transistor P42 and an Nch transistor N42 are turned off, and the second comparator 21b is under non-selection. The current consumption in the first comparator 21a is Ic (fH) and the transition of the output voltage of the first comparator 21a results in Vc (fH).

The frequency judging circuit 28 outputs the "H" level as the control signal Sc in the case that the clock signal CLK has any frequency lower than the reference level. The Pch transistor P42 and the Nch transistor N42 are turned on, and the second comparator 21b is in a state of selection. Further, the Pch transistor P32 and the Nch transistor N32 are turned off, and the first comparator 21a is under non-selection. The current consumption in the second comparator 21b is Ic (fL), and the transition of the output voltage of the second comparator 21b results in Vc (fL).

The performance of the comparator can be switched in the same manner when the register 29 is activated in place of the frequency judging circuit 28 so that the selection signal Sx is controlled by the set value of the register 29.

As described, the performance of the comparator is appropriately switched in accordance with the frequency of the clock signal CLK. As a result, the increase of the current consumption due to the excessive performance of the comparator can be prevented.

Fifth Preferred Embodiment

A fifth preferred embodiment of the present invention corresponds to the combination of the third preferred embodiment and the fourth preferred embodiment.

Figure 8:
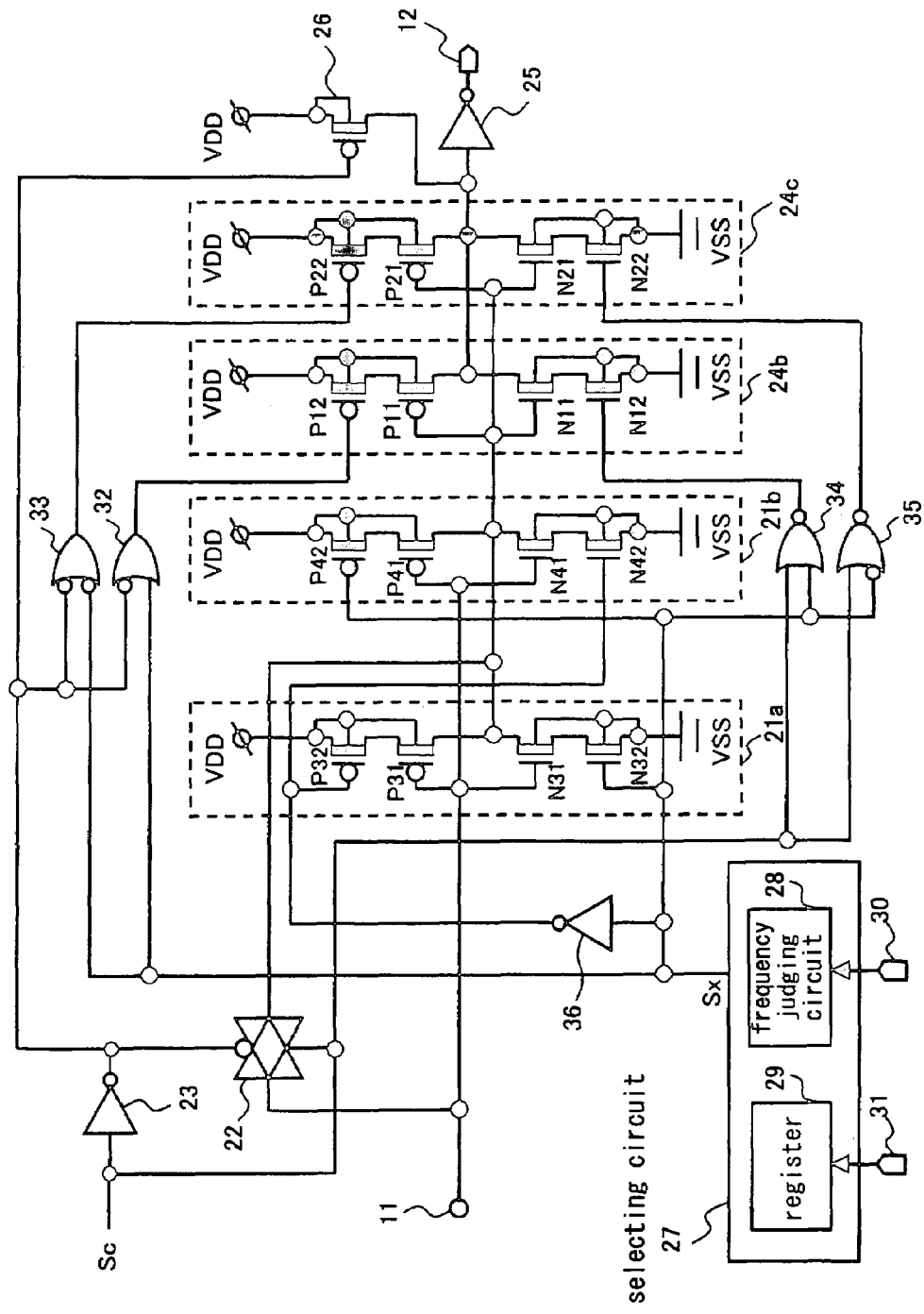
FIG. 8 is a circuit diagram illustrating a configuration of a main part (current consumption countermeasure circuit) of an A/D converter of an successive approximation type according to a fifth preferred embodiment of the present invention.

FIG. 8 is a circuit diagram illustrating a configuration of a main part (current consumption countermeasure circuit) of an A/D converter of an successive approximation type according to the fifth preferred embodiment. Any component shown in FIG. 8 provided with the same reference numeral as shown in FIG. 4 according to the third preferred embodiment and FIG. 6 according to the fourth preferred embodiment is similarly configured and not described below again. In the present preferred embodiment, two inverter, which are a first comparator 21a comprising an inverter of a tri-state type with a first performance and a second comparator 21b comprising an inverter of a tri-state type with a second performance, are used as the comparator of the chopper type so that they can be switched depending on conditions. The first performance is higher than the second performance. The first comparator 21a and the second comparator 21b are connected in parallel to each other between the analog value input/output terminal 11 and the inverter 24 in the first stage.

Further, two inverters, which are an inverter 24b with a first performance in a first stage and an inverter 24c with a second performance in the first stage, are used as the buffering inverter of the tri-state type in the first stage so that they can be switched depending on the conditions. The first performance is higher than the second performance. The inverter 24b with the first performance and the inverter 24c with the second performance are connected in parallel to each other between the comparator 21 and the inverter 25 in the second stage.

The frequency judging circuit 28 judges the frequency of the clock signal CLK from the clock input terminal 30, and outputs the "L" level as the selection signal Sx in the case of any frequency higher than the reference level. The first comparator 21a and the inverter 24b with the first performance are in a state of selection. The second comparator 21b and the inverter 24c with the second performance are under non-selection.

The frequency judging circuit 28 outputs the "H" level as the control signal Sc in the case that the clock signal CLK has any frequency lower than the reference level. The second comparator 21b and the inverter 24c with the second performance are in a state of selection. The first comparator 21a and the inverter 24b with the first performance are under non-selection.

As described, the performances of the comparator and the buffering circuit are appropriately switched in accordance with the frequency of the clock signal CLK. As a result, the increase of the current consumption due the excessive performances of the comparator and the buffering circuit can be prevented.

Sixth Preferred Embodiment

A sixth preferred embodiment of the present invention relates to a reference voltage generating circuit in an A/D converter of an successive approximation type. FIG. 9 is a circuit diagram illustrating a configuration of a main part (reference voltage generating circuit and sample hold circuit) of an A/D converter of an successive approximation type according to the sixth preferred embodiment. Referring to reference numerals shown in FIG. 9, 70 denotes a sample hold circuit, 71 denotes a capacitance array circuit weighted in accordance with a bit, 71a denotes a capacitance of a highest-ranking bit, 71n denotes a capacitance of a lowest-ranking bit, 72 denotes the reference voltage generating circuit, 73 denotes a ladder resistance circuit for supplying a weighted reference voltage, 74 denotes a high-potential side reference power supply, 75 denotes a low-potential side reference power supply, 76 denotes a group of analog switches, 77 denotes a switching element in which an Nch transistor is used, and 21 denotes a comparator of a chopper type.

The group of analog switches 76 sequentially supplies the reference voltage to respective capacitances of the capacitance array circuit 71 per bit from a highest-ranking bit to a lowest-ranking bit using a timing signal Ss synchronizing with the clock signal CLK from the control circuit 80. The ladder resistance circuit 73 is inserted in series between the high-potential side reference power supply 74 and the low-potential side reference power supply 75 as the source power supplies. Further, the switching element 77 is inserted so that the ladder resistance circuit 73 is connected or disconnected to the source power supplies. A control signal St from the control circuit 80 is loaded to a gate of the switching element 77 so that the switching element 77 is turned on/off.

An operation is described referring to a timing chart shown in FIG. 10.

In the successive comparison period, the timing signal Ss sequentially turns on each of analog switches per bit from the highest-ranking bit to the lowest-ranking bit in the group of analog switches 76. Thereby, the reference voltage is supplied from the reference voltage generating circuit 72 to the electric charge charged to the corresponding capacitance of the capacitance array circuit 71. The respective switches in the group of analog switches 76 are constructed in such a manner that when one of the switches arbitrarily selected is operated, all of the other switches are non-operable.

When one of the group of analog switches 76 corresponding to a bit is turned on, an analog value sampled and held in the corresponding capacitance and the supplied reference voltage are compared to each other in the comparator 21. The supplied reference voltage on is the reference power supply VDD on the high-potential side that is constant in a group of bits weighted by relevant capacitance values (a half of the bits on the higher-ranking side), and is different per bit in a group of bits weighted by relevant inputted voltages (a half of the bits on the lower-ranking side).

In the capacitance array circuit 71 controlled by the group of analog switches 76, the reference power supply VDD on the high-potential side is always supplied to the respective capacitances of the group of bits weighted by the capacitance values. The application of the reference power supply VDD on the high-potential side is irrelevant to the ladder resistance circuit 73, which means that it is unnecessary to supply the current flow in the ladder resistance circuit 73 in a first half of the successive comparison period and a sampling and holding period where the analog values of the group of bits weighted by the capacitance values are subjected to the comparison. More specifically, in the first half of the successive comparison period and the sampling and holding period, the switching element 77 is turned off, and the ladder resistance circuit 73 is placed under the non-operation. Thereby, the current consumption in the ladder resistance circuit 73 during the relevant periods becomes zero.

In a latter half of the successive comparison period where the group of bits weighted by the inputted voltages is subjected to the comparison, the switching element 77 is turned on, and the ladder resistance circuit 73 is activated. The respective switches of the group of bits which is the half of the bits on the lower-ranking side in the group of analog switches 76 are sequentially turned on, and the reference voltages such as ½ VDD and ¼ VDD are sequentially generated and supplied to the corresponding capacitances.

As described, according to the present preferred embodiment, the current consumption can be reduced by giving limitation to the period for supplying the current flow to the ladder resistance circuit 73 in the successive comparison period.

While explanations have been given the preferred embodiments of this invention, it should be understood that various modifications may be made thereof, and it will be covered in the appended claims and all of such modifications will fall within the true spirit and scope of this invention.

What is claimed is:

1. An A/D converter of an successive approximation type comprising:
    a sample hold circuit for retaining an input analog signal during a sampling period;
    a reference voltage generating circuit for generating a reference voltage compared to the retained input analog signal during a successive comparison period;
    a comparator for comparing the reference voltage generated by the reference voltage generating circuit to a value of the input analog signal retained in the sample hold circuit;
    a control circuit for successively controlling the reference voltage generating circuit so that a value of the reference voltage approximates to the value of the input analog signal retained in the sample hold circuit based on an output value of the comparator per bit;

a buffering circuit for outputting an output value corresponding to an output voltage of the comparator; and a latch circuit for retaining the output value of the buffering circuit corresponding to the output value of the comparator per bit as a digital value, wherein a buffering control circuit for blocking a power supply to the buffering circuit during the sampling period is provided.

2. The A/D converter of the successive approximation type according to claim 1, wherein the buffering circuit consists of an inverter of a tri-state type, and the buffering control circuit is constructed to turn off a control transistor of the tri-state inverter during the sampling period and turn on the control transistor of the tri-state inverter during the successive comparison period.

3. The A/D converter of the successive approximation type according to claim 1, wherein an inverter for buffering is further connected to a subsequent stage of the tri-state inverter constituting the buffering circuit, a pull-up circuit is connected to a connection point of the tri-state inverter and the buffering inverter, and the buffering control circuit is constructed to turn off a control transistor of the tri-state inverter and turn on the pull-up circuit during the sampling period, and turn on the control transistor of the tri-state inverter and turn off the pull-up circuit during the successive comparison period.

4. The A/D converter of the successive approximation type according to claim 1, wherein a first buffering circuit with a first performance and a second buffering circuit with a second performance are provided as the buffering circuit, a select circuit for selecting one of the first and second buffering circuits is provided, and the buffering control circuit blocks the power supply to the buffering circuit selected by the select circuit during the sampling period, while always blocking the power supply to the buffering circuit not selected by the select circuit.

5. The A/D converter of the successive approximation type according to claim 1, wherein a first comparator with a first performance and a second comparator with a second performance are provided as the comparator, and a select circuit for selecting one of the first and second comparators is provided, the select circuit is always supplying the power supply to the selected comparator, while always blocking the power supply to the comparator not selected.

6. The A/D converter of the successive approximation type according to claim 1, wherein a first buffering circuit with a first performance and a second buffering circuit with a second performance are provided as the buffering circuit, a first comparator with a first performance and a second comparator with a second performance are provided as the comparator, a select circuit for selecting one of the first and second comparators and selecting one of the first and second buffering circuits is provided, the buffering control circuit blocks the power supply to the buffering circuit selected by the select circuit during the sampling period, while always blocking the power supply to the buffering circuit not selected by the select circuit, and the select circuit supplies the power supply to the selected comparator, while always blocking the power supply to the comparator not selected.

7. The A/D converter of the successive approximation type according to claim 4, wherein the select circuit is constructed to be controlled in accordance with a clock frequency.

8. The A/D converter of the successive approximation type according to claim 5, wherein the select circuit is constructed to be controlled in accordance with a clock frequency.

9. The A/D converter of the successive approximation type according to claim 6, wherein the select circuit is constructed to be controlled in accordance with a clock frequency.

10. The A/D converter of the successive approximation type according to claim 4, wherein the select circuit is constructed to be controlled in accordance with a register value externally set.

11. The A/D converter of the successive approximation type according to claim 5, wherein the select circuit is constructed to be controlled in accordance with a register value externally set.

12. The A/D converter of the successive approximation type according to claim 6, wherein the select circuit is constructed to be controlled in accordance with a register value externally set.

13. An A/D converter of an successive approximation type comprising:

a sample hold circuit for retaining an input analog signal during a sampling period;

a reference voltage generating circuit for generating a reference voltage compared to the retained input analog signal during a successive comparison period;

a comparator for comparing the reference voltage generated by the reference voltage generating circuit to a value of the input analog signal retained in the sample hold circuit;

a control circuit for successively controlling the reference voltage generating circuit so that a value of the reference voltage approximates to the value of the input analog signal retained in the sample hold circuit based on an output value of the comparator per bit;

a buffering circuit for outputting an output value corresponding to an output voltage of the comparator; and a latch circuit for retaining the output value of the buffering circuit corresponding to the output value of the comparator per bit as a digital value, wherein a circuit for stopping the operation of the reference voltage generating circuit is provided in the reference voltage generating circuit so that the reference voltage generating circuit is stopped during a period when the supply of the reference voltage is unnecessary in the sampling period or a period when a voltage externally inputted is used as the reference voltage in the successive comparison period.

* * * * *